United States Patent [19]
Bito et al.

[11] Patent Number: 6,025,613
[45] Date of Patent: Feb. 15, 2000

[54] SEMICONDUCTOR DEVICE CAPABLE OF REDUCING LEAK CURRENT AND HAVING EXCELLENT PINCH-OFF CHARACTERISTIC AND METHOD OF MANUFACTURING THE SAME

[75] Inventors: Yasunori Bito; Naotaka Iwata, both of Tokyo, Japan

[73] Assignee: NEC Corporation, Tokyo, Japan

[21] Appl. No.: 09/022,384

[22] Filed: Feb. 12, 1998

[30] Foreign Application Priority Data

Feb. 12, 1997 [JP] Japan ..................................... 9-027141

[51] Int. Cl.$^7$ ................. H01L 31/0328; H01L 31/0336; H01L 31/072; H01L 31/109
[52] U.S. Cl. ............................ 257/192; 325/194; 325/195
[58] Field of Search ..................... 257/192, 194, 257/195

[56] References Cited

U.S. PATENT DOCUMENTS

| | | | |
|---|---|---|---|
| 4,960,718 | 10/1990 | Aina | 437/22 |
| 4,987,008 | 1/1991 | Yamazaki et al. | 427/53.1 |
| 5,081,511 | 1/1992 | Tehrani et al. | 357/16 |
| 5,432,356 | 7/1995 | Imamura | 257/24 |
| 5,449,928 | 9/1995 | Matsugatami et al. | 257/194 |
| 5,493,136 | 2/1996 | Matsuzaki et al. | 257/287 |
| 5,760,427 | 6/1998 | Onda | 257/194 |
| 5,856,685 | 1/1999 | Nakayama | 257/192 |

OTHER PUBLICATIONS

C.A. Pan et al., "High–quality transparent conductive indium oxide films prepared by thermal evaporation", *Appl. Phys. Lett.*, vol. 37, No. 2, Jul. 15, 1980, pp. 163–165.

K. Kasahara et al., "MBE Grown Lattice Mismatched AlGaAs/n InP Hetero–MIS Structure and Its Characterization", *Solid–State Electronics*, vol. 33, Supplement, 1990, pp. 411–416.

K. Asano et al., "Nillimeter–wave AlGaAs Hetero–MIS Gate InP Field Effect Transistors", *IEDM 88*, pp. 187–190, 1988.

*Primary Examiner*—William Mintel
*Attorney, Agent, or Firm*—Sughrue, Mion, Zinn, Macpeak & Seas, PLLC

[57] ABSTRACT

In a method of manufacturing a semiconductor device, the InP substrate is subjected to a $NH_3$ plasma processing by a plasma CVD apparatus into which $NH_3$ gas is introduced. The InP oxide film is deoxided and removed therefrom and an InN (nitride) film is then formed thereon. $S_iH_3$ gas and $NH_3$ gas are introduced into the plasma CVD apparatus to form a SiNx spacer layer on the InN (nitride) film. A source electrode and drain electrode are formed as ohmic electrodes. A Pt layer is stacked on the InP channel region by evaporation lift-off or ion beam sputter method to form a gate electrode. Thereafter, by a process similar to that of forming the SiNx/InN spacer layer, a SiNx/InN passivation film is formed on all over the InP substrate including the source electrode, the drain electrode, and the gate electrode. Accordingly, a semiconductor device protected by the passivation film is completed.

3 Claims, 12 Drawing Sheets

FIG. I PRIOR ART
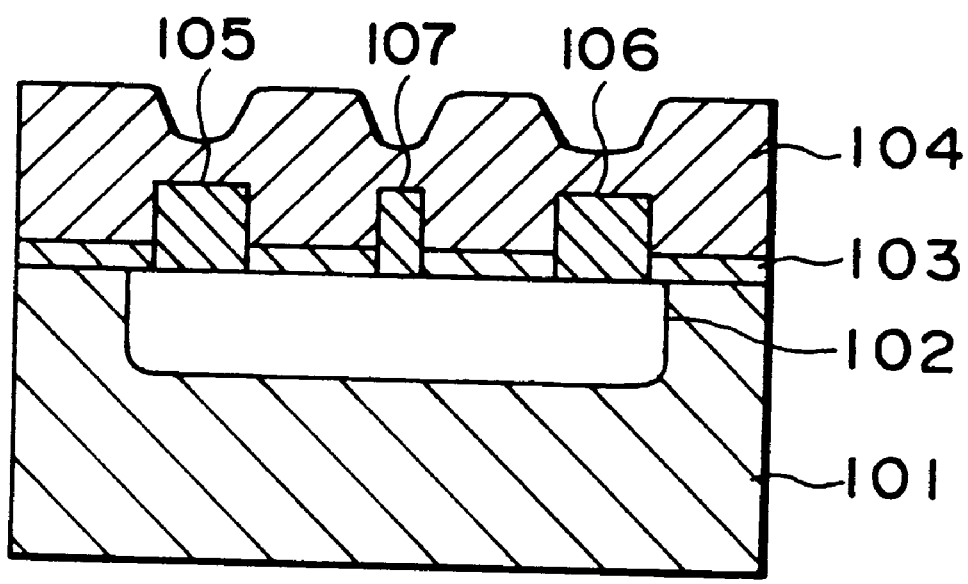

SEMICONDUCTOR DEVICE CAPABLE OF REDUCING LEAK CURRENT AND HAVING EXCELLENT PINCH-OFF CHARACTERISTIC AND METHOD OF MANUFACTURING THE SAME

BACKGROUND OF THE INVENTION

This invention relates to a semiconductor device which has an InP layer and a method of manufacturing the semiconductor device.

Compared with GaAs, InP has been recognized as an attractive material for channels of power semiconductor devices, such as a power field effect transistor (FET), because of its high peak electron velocity, high thermal conductivity, and high breakdown field. Several types of the semiconductor devices have been reported as such one having an InP channel, those are MESFET, MISFET, Retero MISFET, and the like.

Conventionally, in processes of manufacturing MESFET, wet-etching is employed as a pre-process before growing a passivation film or a spacer layer. However, the MESFET having the InP channel thus manufactured do not have a good pinch-off characteristic. This is because the pre-process technique employing an wet-etchant for the passivation film or the spacer layer is immature. Namely, an InP oxide film including $In_2O_3$ is formed in an interface between an InP substrate and such a passivation film or a spacer layer, so that an interface leak current is increased therebetween. A similar problem is reported in Applied Physics Letters, pages 163 to 165, volume 37, 1980. As taught by the above-referenced paper, the InP oxide film including the $In_2O_3$ is a conductive metal oxide film.

On the other hand, a conventional MISFET or Hetero MISFET comprises a thick silicon oxide or a thick hetero semiconductor crystal inserted between a gate and a shotkey layer for the purpose of reducing leak current from the gate. Further, the conventional MISFET or Hetero MISFET also comprises a thick insulation film or a thick hetero semiconductor crystal interposed between a metal gate and a channel for the purpose of improving gate breakdown voltage. As a result, a distance therebetween becomes large and decreases mutual conductance.

Moreover, when a hetero semiconductor crystal lattice-mismatched to the InP is employed as a Schottky layer on the InP substrate in the Hetero MISFET, dislocation or interface state due to lattice-mismatching is inevitably caused to occur. Leak current flowing through the Schottky layer is generated to decrease the aforesaid gate breakdown voltage. Furthermore, occurs that frequency is dispersed and mutual conductance is decreased the upper portions.

In the conventional Hetero MISFET, the InP layer and the hetero semiconductor crystal including no P (phosphorous) are continuously grown by the use of molecular beam epitaxiy (MBE) or metal organic chemical vapor deposition (MOCVD), a source of phosphorous must be changed. However, it is very difficult to control the flow of phosphorous, because of its extremely high vapor pressure. Consequently, a steep hetero interface cannot be obtained in the conventional Hetero MISFET. Accordingly, a conduction band profile is disarranged. Particularly, when the hetero semiconductor crystal including no phosphorous is grown on the InP layer, an electron transfer characteristic in the InP layer is deteriorated.

SUMMARY OF THE INVENTION

It is therefore an object of the present invention to provide a semiconductor device capable of reducing leak current and having excellent pinch-off characteristic and a method of manufacturing the semiconductor device.

It is another object of the present invention to provide a semiconductor device of the type described in which frequency and conductivity characteristics can be improved and a method of manufacturing the semiconductor device.

It is yet another object of the present invention to provide a semiconductor device which has large mutual conductivity without deteriorating gate breakdown voltage and a method of manufacturing the semiconductor device.

It is still another object of the present invention to provide a semiconductor device which has a good electron transfer characteristic and a method of manufacturing the semiconductor device.

According to an aspect of the present invention, there is provided a method of manufacturing a semiconductor device which consists mainly of a semiconductor crystal having an InP layer, the method comprising the steps of: (A) removing an oxide InP by a processing selected from the group consisting of $N_2H_4$ plasma processing, $N_3H_6$ plasma processing, $NH_3$ plasma processing, and $N_2$ plasma processing; and (B) forming SiNx layer on the InP layer.

The method may comprise the steps of: (A) making a surface of the InP layer be subjected to a processing selected from the group consisting of $N_2H_4$ plasma processing, $N_3H_6$ plasma processing, $NH_3$ plasma processing, and $N_2$ plasma processing to form an InN film on the surface of the InP layer; and (B) forming SiNx layer on the InN film.

The method may comprise the steps of: (A) removing an oxide InP by a processing selected from the group consisting of $N_2H_4$ plasma processing, $N_3H_6$ plasma processing, $NH_3$ plasma processing, and $N_2$ plasma processing; and (B) forming an InN film on a surface of the InP layer by the same processing as that of the removing an oxide InP step selected from the group consisting of $N_2H_4$ plasma processing, $N_3H_6$ plasma processing, $NH_3$ plasma processing, and $N_2$ plasma processing.

According to another aspect of the present invention, there is provided a method of manufacturing a semiconductor device comprising the steps of: (A) forming a primary layer having a primary composition of InP; and (B) forming a secondary layer on the primary layer; the secondary layer having a secondary composition selected from the group consisting of AlGaAs, GaAs, AlInP, AlGaP, and AlGaInP.

The method may comprise the steps of: (A) forming a primary layer having a primary composition of InP; and (B) forming a secondary layer on the primary layer; the secondary layer comprising two layers selected from the group consisting of two layers of AlGaAs and AlInAs, two layers of GaAs and AlInAs, two layers of AlInP and AlInAs, two layers of AlGaP and AlInAs, and two layers of AlGaInP and AlInAs.

The method may comprise the steps of: (A) forming a primary layer having a primary composition of InP; and (B) forming a secondary layer on the primary layer; the secondary layer comprising three layers selected from the group consisting of three layers of AlGaAs, AlInAs and AlGaAs, three layers of GaAs, AlInAs and GaAs, three layers of AlInP, AlInAs and AlInP, three layers of AlGaP, AlInAs and AlGaP, and three layers of AlGaInP, AlInAs and AlGaInP.

According to still another aspect of the present invention, there is provided a field effect transistor which consists mainly of a semiconductor crystal having an InP layer and which includes source, drain and gate electrodes, the field effect transistor comprising: (A) a SiNx spacer layer which separates the source, the drain and the gate electrodes each other; and (B) an InN film formed between the InP layer and the SiNx spacer layer.

The field effect transistor may comprise: (A) a primary layer having a primary composition of InP; and (B) a secondary layer which is formed on the primary layer and which has a secondary composition selected from the group consisting of AlGaAs, GaAs, AlInP, AlGaP, and AlGaInP.

The field effect transistor may comprise: (A) a primary layer having a primary composition of InP; and (B) a secondary layer which is formed on the primary layer and which comprises two layers selected from the group consisting of two layers of AlGaAs and AlInAs, two layers of GaAs and AlInAs, two layers of AlInP and AlInAs, two layers of AlGaP and AlInAs, and two layers of AlGaInP and AlInAs.

The field effect transistor may comprise: (A) a primary layer which defines an InP channel region; and (B) a secondary layer which is formed on the primary layer and which comprises three layers selected from the group consisting of three layers of AlGaAs, AlInAs and AlGaAs, three layers of GaAs, AlInAs and GaAs, three layers of AlInP, AlInAs and AlInP, three layers of AlGaP, AlInAs and AlGaP, and three layers of AlGaInP, AlInAs and AlGaInP.

BRIEF DESCRIPTION OF THE DRAWINGS

FIG. 1 is a schematic vertical sectional view of a conventional semiconductor device;

DESCRIPTION OF THE PREFERRED EMBODIMENTS

Figure 2A:
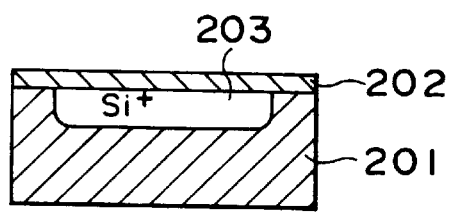
FIGS. 2A to 2F are schematic vertical sectional views of a semiconductor device at various steps of a method according to a first embodiment of this invention.

Referring to FIG. 1, a conventional semiconductor device will be described at first in order to facilitate an understanding of the present invention.

In FIG. 1, the conventional semiconductor device comprises an InP semiconductor substrate 101, a channel region 102 formed in the InP semiconductor substrate 101, a spacer layer or a passivation film 104 formed on the InP semiconductor substrate 101, an InP oxide film 103 formed between the InP semiconductor substrate 101 and a spacer layer or a passivation film 104, a source electrode 105, a drain electrode 106, and a gate electrode 107 each of which is formed on the channel region 102.

Thus, in the illustrated conventional semiconductor device, the InP oxide film 103 including $In_2O_3$ is formed in an interface between the InP semiconductor substrate 101 and the spacer layer or the passivation film 104. As a result, large leak current flowing through the InP oxide film 103 inevitably occurs. Consequently, it is very difficult to obtain the conventional semiconductor device capable of reducing the leak current.

Referring now to FIG. 2, description will proceed to a semiconductor device and a method of manufacturing the semiconductor device according to a first embodiment of the present invention.

In FIGS. 2A through 2F, illustrated are sectional views each of which shows each process of the method of manufacturing the semiconductor device according to the first embodiment.

In the example being illustrated, at first, a semi-insulated InP substrate 201 is prepared in a known manner. The semi-insulated InP substrate 201 has a principal surface directed upwards of FIG. 2. As illustrated in FIG. 2A, $Si^+$ ions are implanted into the semi-insulated InP substrate 201 by the use of an implantation mask having opening area for a channel region on conditions that implantation energy is 50 keV and that implantation amount is $4 \times 10^{12}$ $cm^{-2}$. The implantation mask is then removed. An anneal protection film such as glass phosphide is grown on the principal surface of the semi-insulated InP substrate 201. The semi-insulated InP substrate 201 is subjected to an activated annealing for fifteen minutes at a temperature of 660° C. to form a channel region 203, as illustrated in FIG. 2A. The anneal protection film is thereafter removed by fluoric acid. Herein, an InP oxide film 202 is inevitably produced on the semi-insulated InP substrate 201 and the channel region 203, as depicted in FIG. 2A.

Figure 2B:
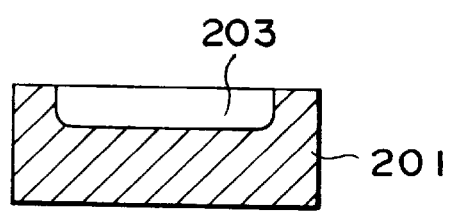
Figure 2C:
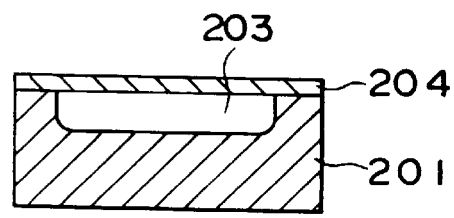
Figure 2D:
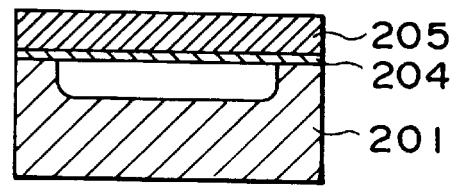
Figure 2E:
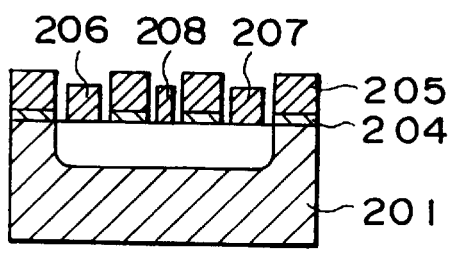
Figure 2F:
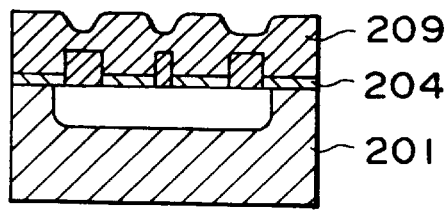

Next, the InP substrate 201 having the InP oxide film 202 in the surface thereof is subjected to $NH_3$ plasma processing by the use of plasma CVD apparatus into which $NH_3$ gas is introduced. As a result, the InP oxide film 202 is deoxided and removed from the surface of the InP substrate 201 by the $NH_3$ plasma for the deoxidation, as depicted in FIG. 2B. Further, during the $NH_3$ plasma processing, an InN (nitride) film 204 is formed on the InP substrate 201 and the channel region 203 to have a thickness of 30 nm, as depicted in FIG. 2C. Then, $S_iH_3$ gas and $NH_3$ gas are introduced into the plasma CVD apparatus. A SiNx spacer layer 205 is thereby formed on the InN (nitride) film 204 to have a thickness of 350 nm, as depicted in FIG. 2D. By the use of an etching mask having opening area for an ohmic electrode region, the SiNx spacer layer 205 and the InN (nitride) film 204 are etched by fluoric acid. As illustrated in FIG. 2E, an AuGe layer is stacked on the InP channel region 203 by evaporation lift-off and alloying(for example, 400° C./one minute) to form a source electrode 206 and a drain electrode 207, respectively as ohmic electrodes. On the other hand, by the use of an etching mask having opening area for a gate electrode region, the SiNx spacer layer 205 and the InN (nitride) film 204 are etched by fluoric acid. A Pt layer is stacked on the InP channel region 203 by evaporation lift-off or ion beam sputter method to form a gate electrode 208. Thereafter, by a process similar to that of forming the SiNx/InN spacer layer 205, a SiNx/InN passivation film 209 is formed on all over the InP substrate 201 including the source electrode 206, the drain electrode 207, and the gate electrode 208, as illustrated in FIG. 2F. Accordingly, a semiconductor device protected by the passivation film 209 is completed, as illustrated in FIG. 2F.

In this embodiment, by the $NH_3$ plasma processing carried out before processes of forming films, not only InP oxided formed on the surface of the InP substrate 201 was removed but also InN (nitride) film was formed thereon. Further, after removal of the InP oxided on the surface of the InP substrate 201, both of the two processes of forming the InN (nitride) film and depositing SiNx films were carried out not only within the same CVD apparatus but also in vacuum conditions. Consequently, oxidation of InP could be sufficiently prevented. As a result, interface leak current could be sufficiently reduced. Some samples of InP MESFET were fabricated through the processes similar to those mentioned with reference to FIGS. 2A through 2F to investigate pinch-off characteristics thereof. The fabricated samples proved good pinch-off characteristics ranging a drain voltage of 10V at the maximum drain current of 250 mA/mm.

In the first embodiment mentioned above, $NH_3$ gas is employed to remove a natural oxidation film and to form an InN (nitride) film. However, $N_2H_4$ gas, $N_3H_6$ gas, or $N_2$ gas may be alternatively employed. Further, the channel region was formed by ion implantation in the first embodiment, the ion implantation can be replaced with MBE or MOCVD method. In such a case, an undoped $Al_{0.48}In_{0.52}As$ buffer layer, and an InP channel layer of 100 nm thickness with Si of $4 \times 10^{17}$ cm$^{-3}$ doped are sequentially grown by epitaxy on the semi-insulated InP substrate.

Referring to FIG. 3, description will proceed to a semiconductor device and a method of manufacturing the semiconductor device according to a second embodiment of the present invention.

In FIGS. 3A through 3F, illustrated are sectional views each of which shows each process of the method of manufacturing the semiconductor device according to the second embodiment.

Figure 3A:
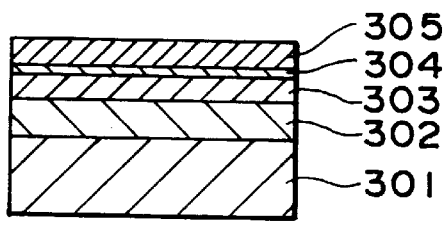
FIGS. 3A to 3F are schematic vertical sectional views of a semiconductor device at various steps of a method according to a second embodiment of this invention.

In the example being illustrated, a semi-insulated InP substrate 301 is prepared in a known manner. The semi-insulated InP substrate 301 has a principal surface directed upwards of FIG. 3. As illustrated in FIG. 3A, an undoped $Al_{0.48}In_{0.52}As$ buffer layer 302 having a thickness not larger than 300 nm, an InP channel layer 303 of 100 nm thickness with doped Si of $4 \times 10^{17}$ cm$^{-3}$, an undoped $Al_{0.3}Ga_{0.7}As$ Schottky layer 304 having a thickness of 6 nm, and a $Ga_{0.47}In_{0.53}As$ cap layer 305 of 50 nm thickness with doped Si of $5 \times 10^{18}$ cm$^{-3}$ are sequentially grown on the principal surface of the semi-insulated InP substrate 301 by MBE method. Besides, the undoped $Al_{0.48}In_{0.52}As$ buffer layer 302 is substantially lattice-matched with the semi-insulated InP substrate 301. The buffer layer 302 must have a composition of $Al_xIn_{1-x}As(x=0.48\pm0.01)$. This is also assumed in the following third through eleventh embodiments.

Figure 3D:
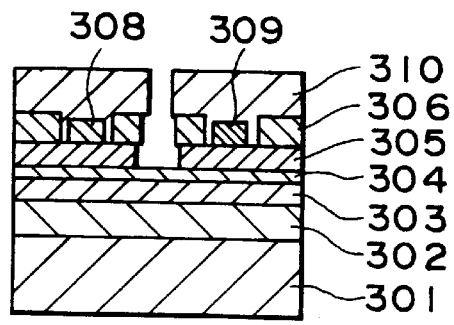
Figure 3B:
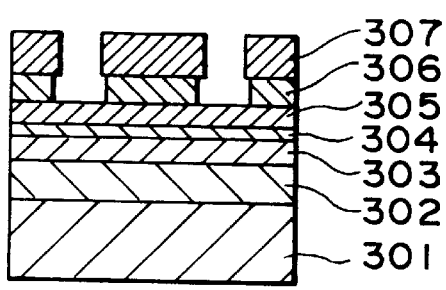
Figure 3E:
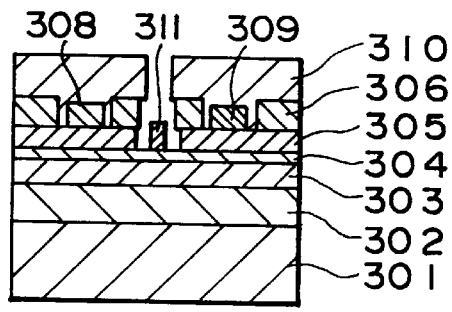
Figure 3C:
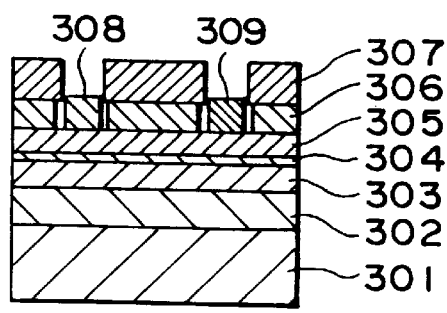
Figure 3F:
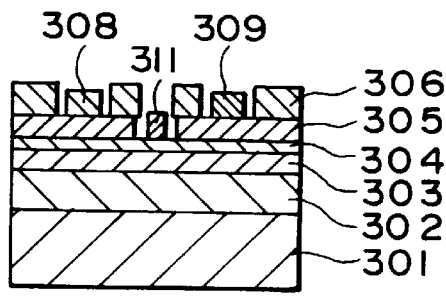

Next, a SiNx spacer layer 306 is formed on the $Ga_{0.47}In_{0.53}As$ cap layer 305 to have a thickness of 350 nm, as depicted in FIG. 3B. By the use of an etching mask 307 having opening area for an ohmic electrode region, the SiNx spacer layer 306 is removed by fluoric acid, as illustrated in FIG. 3B. As illustrated in FIG. 3C, an AuGe layer is stacked on the $Ga_{0.47}In_{0.53}As$ cap layer 305 by evaporation lift-off and alloying(for example, 400° C./one minute) to form a source electrode 308 and a drain electrode 309, respectively as ohmic electrodes. On the other hand, the SiNx spacer layer 306 is removed by fluoric acid by the use of an etching mask 210 having opening area for a gate electrode region while the $Ga_{0.47}In_{0.53}As$ cap layer 305 is removed by a tartaric etchant, as illustrated in FIG. 3D. Thereafter, a gate electrode 211 of WSi is formed on the undoped $Al_{0.3}Ga_{0.7}As$ Schottky layer 304, as shown in FIG. 3E. The etching mask 210 is then removed. Accordingly, a semiconductor device of the second embodiment is completed, as illustrated in FIG. 3F.

In the second embodiment, height of Schottky barrier is as large as 1.0 eV by forming the undoped $Al_{0.3}Ga_{0.7}As$ Schottky layer 304. The value is large enough to reduce gate leak current. Since the undoped $Al_{0.3}Ga_{0.7}As$ Schottky layer 304 has a thickness not larger than critical thickness thereof, defect or dislocation does not occur therein (Hereinunder, the critical thickness is the maximum thickness by which dislocation does not occur). Further, it becomes possible that the density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved with a drain voltage of about 15V. In addition, frequency dispersion is reduced while mutual conductance is prevented from getting smaller in upper portions. The mutual conductance was as large as 300 mS/mm.

In the second embodiment mentioned above, the channel region is formed by epitaxial growth. However, the channel region may be alternatively formed by ion implantation. In such a case, after forming the channel region by ion implantation, an undoped $Al_{0.3}Ga_{0.7}As$ Schottky layer having a thickness of 5 nm, and a $Ga_{0.47}In_{0.53}As$ cap layer of 50 nm thickness with doped Si of $5 \times 10^{18}$ cm$^{-3}$ are sequentially grown by epitaxy. Further, the undoped $Al_{0.3}Ga_{0.7}As$ Schottky layer is employed in the second embodiment. However, a composition of the Schottky layer may be $Al_xGa_{1-x}As$ ($0 \leq x \leq 1$) to obtain the same advantageous effect as the above composition of $Al_{0.3}Ga_{0.7}As$.

Referring to FIG. 4, description will proceed to a semiconductor device and a method of manufacturing the semiconductor device according to a third embodiment of the present invention.

In FIGS. 4A through 4F, illustrated are sectional views each of which shows each process of the method of manufacturing the semiconductor device according to the third embodiment.

Figure 4A:
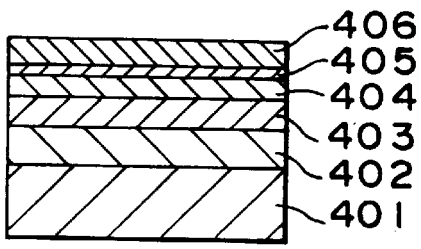
FIGS. 4A to 4F are schematic vertical sectional views of a semiconductor device at various steps of a method according to a third embodiment of this invention.

In the example being illustrated, a semi-insulated InP substrate 401 is prepared in a known manner. The semi-insulated InP substrate 401 has a principal surface directed upwards of FIG. 4. As illustrated in FIG. 4A, an undoped $Al_{0.48}In_{0.52}As$ buffer layer 402 having a thickness of 300 nm, an InP channel layer 403 of 100 nm thickness with doped Si of $4 \times 10^{17}$ cm$^{-3}$, a Schottky layer consisting of two layers of both an undoped $Al_{0.48}In_{0.52}As$ layer 404 having a thickness of 20 nm and an undoped $Al_{0.3}Ga_{0.7}As$ layer 405 having a thickness of 6 nm, and a on the principal surface of the semi-insulated InP substrate 401 by MBE method.

Figure 4B:
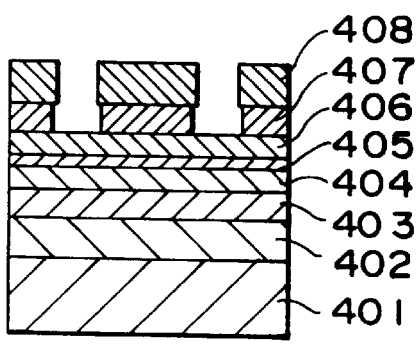
Figure 4C:
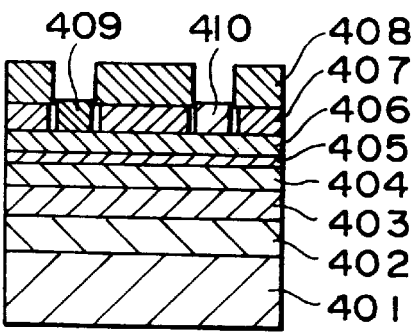
Figure 4D:
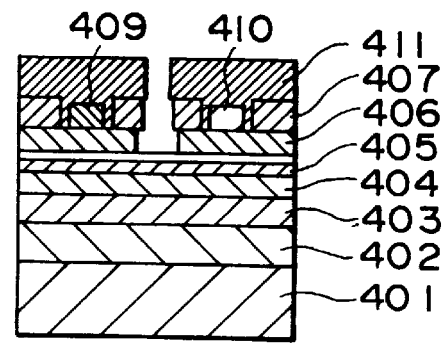
Figure 4E:
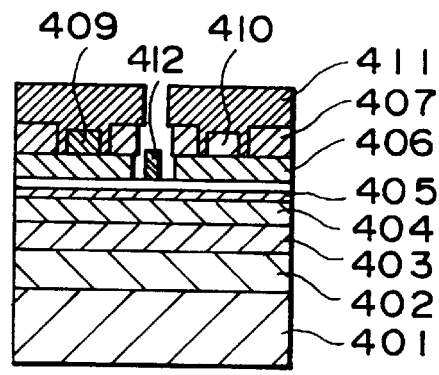
Figure 4F:
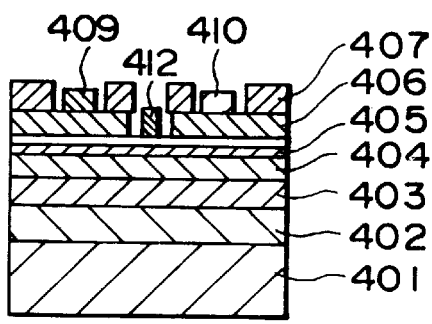

Next, a SiNx spacer layer 407 is formed on the $Ga_{0.47}In_{0.53}As$ cap layer 406, as depicted in FIG. 4B. By the use of an etching mask 408 having opening area for an ohmic electrode region, the SiNx spacer layer 407 is removed by fluoric acid, as illustrated in FIG. 4B. As illustrated in FIG. 4C, an AuGe layer is stacked on the $Ga_{0.47}In_{0.53}As$ cap layer 406 by evaporation lift-off and alloying(for example, 400° C./one minute) to form a source electrode 409 and a drain electrode 410, respectively as ohmic electrodes. On the other hand, the SiNx spacer layer 407 is removed by fluoric acid by the use of an etching mask 411 having an opening area for a gate electrode region while the $Ga_{0.47}In_{0.53}As$ cap layer 406 is removed by a tartaric etchant, as illustrated in FIG. 4D. Thereafter, a gate electrode 412 of WSi is formed on the Schottky layer, as shown in FIG. 4E. The etching mask 411 is then removed. Accordingly, a semiconductor device of the third embodiment is completed, as illustrated in FIG. 4F.

In the third embodiment, height of Schottky barrier is as large as 1.0 eV by forming the Schottky layer consisting of two layers of both the undoped $Al_{0.48}In_{0.52}As$ layer 404 and the undoped $Al_{0.30}Ga_{0.7}As$ layer 405. The value is large enough to reduce gate leak current. Defects or dislocations do not occur in each $Al_{0.3}Ga_{0.7}As$ layer. Further, it becomes possible that the density of surface state is within an order of $10^{10}$ cm$^{31\ 2}$v$^{-1}$. Moreover, distance between the gate and the channel region is small, although a desirable breakdown voltage is achieved. Consequently, an excellent pinch-off characteristic is achieved up to a drain voltage of about 18V. In addition, frequency dispersion is reduced while mutual conductance is prevented from getting smaller in upper portions. The mutual conductance was as large as 290 mS/mm.

In the third embodiment mentioned above, the channel region is formed by epitaxial growth. However, the channel region may be alternatively formed by ion implantation. In such a case, after forming the channel region by ion implantation, the Schottky layer consisting of two layers of both the undoped $Al_{0.48}In_{0.52}As$ layer having a thickness of 20 nm and the undoped $Al_{0.3}Ga_{0.7}As$ layer having a thickness of 6 nm, and the $Ga_{0.47}In_{0.53}As$ cap layer of 50 nm thickness with doped Si of $5\times10^{18}$ cm$^{-3}$ are sequentially grown by epitaxy. Further, a hetero junction semiconductor crystal is grown on the semi-insulated InP substrate by MBE method in the third embodiment. However, a similar hetero junction semiconductor crystal can be obtained by MOCVD method. Moreover, the Schottky layer having a composition of $Al_{0.3}Ga_{0.7}As$ is employed in the third embodiment. However, a composition of the Schottky layer may be $Al_xGa_{1-x}As$ ($0 \leq x \leq 1$) to obtain the same advantageous effect as the above composition of $Al_{0.3}Ga_{0.7}As$.

Referring to FIG. 5, description will proceed to a semiconductor device and a method of manufacturing the semiconductor device according to a fourth embodiment of the present invention.

In FIGS. 5A through 5F, illustrated are sectional views each of which shows each process of the method of manufacturing the semiconductor device according to the fourth embodiment.

Figure 5A:
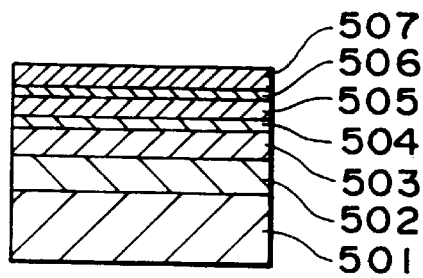
FIGS. 5A to 5F are schematic vertical sectional views of a semiconductor device at various steps of a method according to a fourth embodiment of this invention.

In the example being illustrated, a semi-insulated InP substrate 501 is prepared in a known manner. The semi-insulated InP substrate 501 has a principal surface directed upwards of FIG. 5. As illustrated in FIG. 5A, an undoped $Al_{0.48}In_{0.52}As$ buffer layer 502 having a thickness of 300 nm, an InP channel layer 503 of 100 nm thickness with doped Si of $4\times10^{17}$ cm$^{-3}$, a Schottky layer consisting of three layers of an undoped $Al_{0.3}Ga_{0.7}As$ layer 504 having a thickness of 6 nm, an undoped $Al_{0.48}In_{0.52}As$ layer 505 having a thickness of 13 nm, and an undoped $Al_{0.3}Ga_{0.7}As$ layer 506 having a thickness of 6 nm, and a $Ga_{0.47}In_{0.53}As$ cap layer 507 of 50 nm thickness with doped Si of $5\times10^{18}$ cm$^{-3}$ are sequentially grown on the principal surface of the semi-insulated InP substrate 501 by MBE method.

Figure 5B:
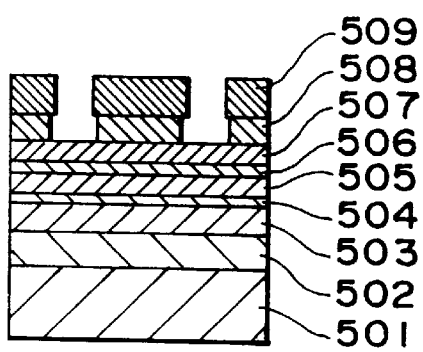
Figure 5C:
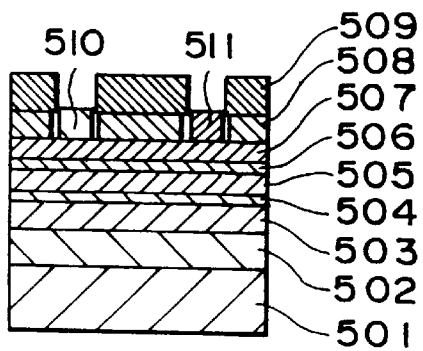
Figure 5D:
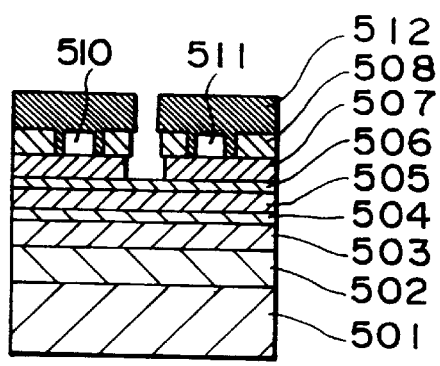
Figure 5E:
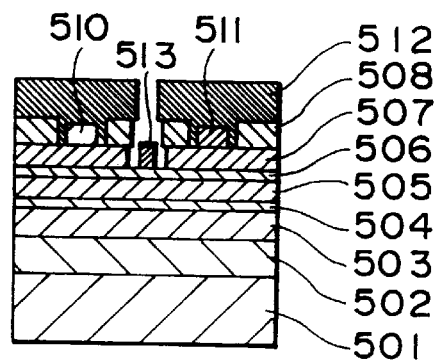
Figure 5F:
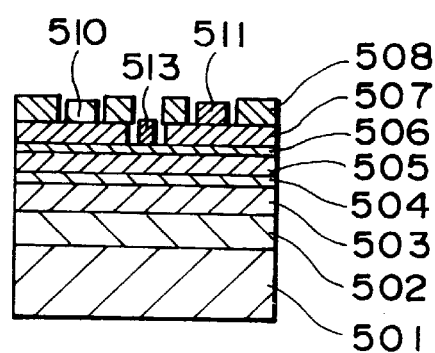

Next, a SiNx spacer layer 508 is formed on the $Ga_{0.47}In_{0.53}As$ cap layer 507, as depicted in FIG. 5B. By the use of an etching mask 509 having opening area for an ohmic electrode region, the SiNx spacer layer 508 is removed by fluoric acid, as illustrated in FIG. 5B. As illustrated in FIG. 5C, an AuGe layer is stacked on the $Ga_{0.47}In_{0.53}As$ cap layer 507 by evaporation lift-off and alloying(for example, 400° C./one minute) to form a source electrode 510 and a drain electrode 511, respectively as ohmic electrodes. On the other hand, the SiNx spacer layer 508 is removed by fluoric acid by the use of an etching mask 512 having an opening area for a gate electrode region while the $Ga_{0.47}In_{0.53}As$ cap layer 507 is removed by a tartaric etchant, as illustrated in FIG. 5D. Thereafter, a gate electrode 513 of WSi is formed on the undoped $Al_{0.3}Ga_{0.7}As$ layer 506, as shown in FIG. 5E. The etching mask 512 is then removed. Accordingly, a semiconductor device of the fourth embodiment is completed, as illustrated in FIG. 5F.

In the fourth embodiment, height of Schottky barrier is as large as 1.0 eV by forming the Schottky layer consisting of three layers of the undoped $Al_{0.3}Ga_{0.7}As$ layer 504, the undoped $Al_{0.48}In_{0.52}As$ layer 505 and the undoped $Al_{0.3}Ga_{0.7}As$ layer 506. The value is large enough to reduce gate leak current. Defects or dislocations do not occur in each $Al_{0.3}Ga_{0.7}As$ layer. Further, it becomes possible that the density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 20V. In addition, frequency dispersion is reduced while mutual conductance is prevented from getting smaller in upper portions. The mutual conductance was as large as 280 mS/mm.

In the fourth embodiment mentioned above, the channel region is formed by epitaxial growth. However, the channel region may be alternatively formed by ion implantation. In such a case, after forming the channel region by ion implantation, the Schottky layer consisting of three layers of the undoped $Al_{0.3}Ga_{0.7}As$ layer having a thickness of 6 nm, the undoped $Al_{0.48}In_{0.52}As$ layer having a thickness of 13 nm, and the undoped $Al_{0.3}Ga_{0.7}As$ layer having a thickness of 6 nm, and the $Ga_{0.47}In_{0.53}As$ cap layer of 50 nm thickness with doped Si of $5\times10^{18}$ cm$^{-3}$ are sequentially grown by epitaxy. Further, a hetero junction semiconductor crystal is grown on the semi-insulated InP substrate by MBE method in the fourth embodiment. However, a similar hetero junction semiconductor crystal can be obtained by MOCVD method. Moreover, the Schottky layer having a composition of $Al_{0.3}Ga_{0.7}As$ is employed in the fourth embodiment. However, a composition of the Schottky layer may be $Al_xGa_{1-x}As$ ($0 \leq x \leq 1$) to obtain the same advantageous effect as the above composition of $Al_{0.3}Ga_{0.7}As$.

Referring to FIG. 6, description will proceed to a semiconductor device and a method of manufacturing the semiconductor device according to a fifth embodiment of the present invention.

In FIGS. 6A through 6F, illustrated are sectional views each of which shows each process of the method of manufacturing the semiconductor device according to the fifth embodiment.

Figure 6A:
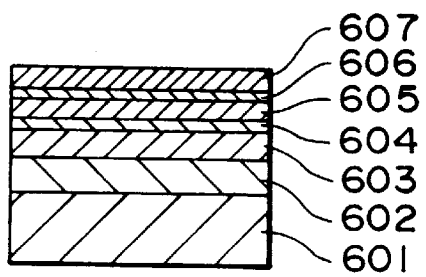
FIGS. 6A to 6F are schematic vertical sectional views of a semiconductor device at various steps of a method according to a fifth embodiment of this invention.

In the example being illustrated, at first, a semi-insulated InP substrate 601 is prepared in a known manner. The semi-insulated InP substrate 601 has a principal surface directed upwards of FIG. 6. As illustrated in FIG. 6A, an undoped $Al_{0.48}In_{0.52}As$ buffer layer 602 having a thickness of 300 nm, an undoped InP channel layer 603 of 100 nm thickness, an undoped $Al_{0.3}Ga_{0.7}As$ layer 604 having a thickness of 2 nm, an $Al_{0.48}In_{0.52}As$ electron supplying layer 605 of 20 nm thickness with delta-doped Si of $4\times10^{12}$ cm$^{-2}$, and an undoped $Al_{0.3}Ga_{0.7}As$ spacer layer 606 having a thickness of 6 nm, and a $Ga_{0.47}In_{0.53}As$ cap layer 607 of 50 nm thickness with doped Si of $5\times10^{18}$ cm$^{-3}$, are sequentially grown on the principal surface of the semi-insulated InP substrate 601 by MBE method.

Figure 6B:
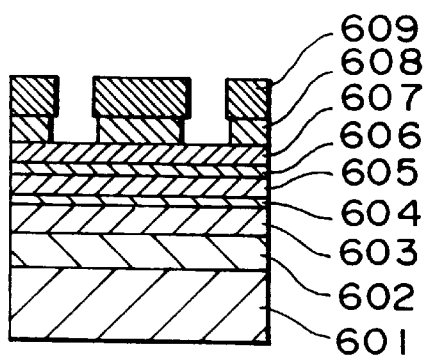
Figure 6C:
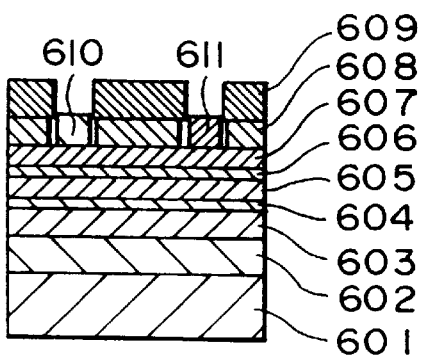
Figure 6D:
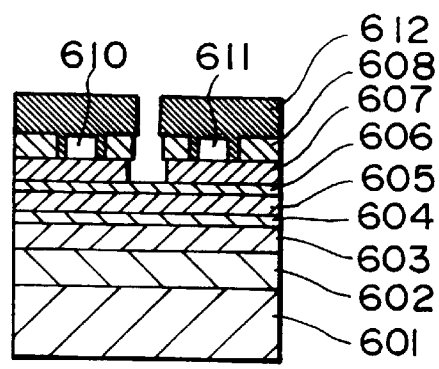
Figure 6E:
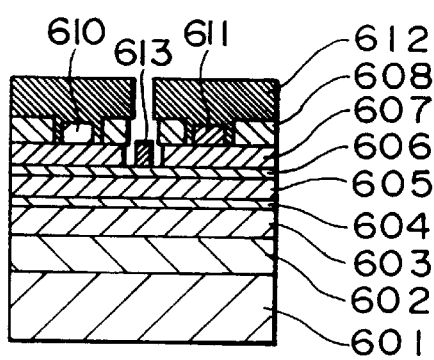
Figure 6F:
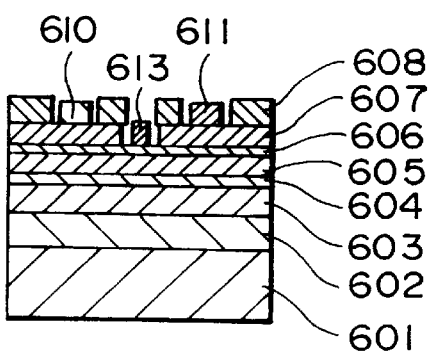

Next, a SiNx spacer layer 608 is formed on the $Ga_{0.47}In_{0.53}As$ cap layer 607, as depicted in FIG. 6B. By the use of an etching mask 609 having opening area for an ohmic electrode region, the SiNx spacer layer 608 is removed by fluoric acid, as illustrated in FIG. 6B. As illustrated in FIG. 6C, an AuGe layer is stacked on the $Ga_{0.47}In_{0.53}As$ cap layer 607 by evaporation lift-off and alloying(for example, 400° C./one minute) to form a source electrode 610 and a drain electrode 611, respectively as ohmic electrodes. On the other hand, the SiNx spacer layer 608 is removed by fluoric acid by the use of an etching mask 612 having an opening area for a gate electrode region while the $Ga_{0.47}In_{0.53}As$ cap layer 607 is removed by a tartaric etchant, as illustrated in FIG. 6D. Thereafter, a gate electrode 613 of WSi is formed on the undoped $Al_{0.3}Ga_{0.7}As$ layer 606, as shown in FIG. 6E. The etching mask 612 is then removed. Accordingly, a semiconductor device of the fifth embodiment is completed, as illustrated in FIG. 6F.

In the fifth embodiment, height of Schottky barrier is as large as 1.0 eV by forming the undoped $Al_{0.3}Ga_{0.7}As$ layer 604, the $Al_{0.48}In_{0.52}As$ electron supplying layer 605 and the undoped $Al_{0.3}Ga_{0.7}As$ spacer layer 606 on the undoped InP channel layer 603. The value is large enough to reduce gate leak current. Defects or dislocations do not occur in each $Al_{0.3}Ga_{0.7}As$ layer. Further, it becomes possible that the density of surface state is within an order of $10^{10}$ cm$^{-2}$v$^{9-1}$. Moreover, distance between the gate and the channel region is small, although a desirable breakdown voltage is achieved. Consequently, an excellent pinch-off characteristic is achieved up to a drain voltage of about 20V in the InP channel HEMT structure. In addition, frequency dispersion is reduced while mutual conductance is prevented from getting smaller in upper portions. The mutual conductance was as large as 280 mS/mm.

In the fifth embodiment mentioned above, a hetero junction semiconductor crystal is grown on the semi-insulated InP substrate by MBE method. However, a similar hetero junction semiconductor crystal can be obtained by MOCVD method. Moreover, the undoped AlGaAs layer 604 and the undoped AlGaAs spacer layer 606 each having a composition of $Al_{0.3}Ga_{0.7}As$ are employed in the fifth embodiment. However, a composition of each AlGaAs layer 604 or 606 may be $Al_xGa_{1-x}As$ ($0 \leq x \leq 1$) to obtain the same advantageous effect as the above composition of $Al_{0.3}Ga_{0.7}As$.

Referring to FIG. 7, description will proceed to a semiconductor device and a method of manufacturing the semiconductor device according to a sixth embodiment of the present invention.

In FIGS. 7A through 7F, illustrated are sectional views each of which shows each process of the method of manufacturing the semiconductor device according to the sixth embodiment.

Figure 7A:
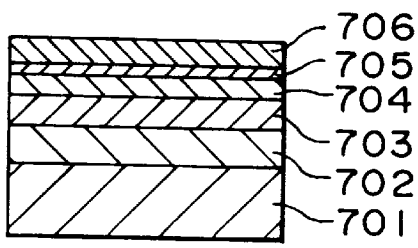
FIGS. 7A to 7F are schematic vertical sectional views of a semiconductor device at various steps of a method according to a sixth embodiment of this invention.

In the example being illustrated, a semi-insulated InP substrate 701 is prepared in a known manner. The semi-insulated InP substrate 701 has a principal surface directed upwards of FIG. 7. As illustrated in FIG. 7A, an undoped $Al_{0.48}In_{0.52}As$ buffer layer 702 having a thickness of 300 nm, an undoped InP channel layer 703 of 100 nm thickness, an $Al_{0.48}In_{0.52}As$ electron supplying layer 704 of 20 nm thickness with delta-doped Si of $4\times10^{12}$ cm$^{-2}$, an undoped $Al_{0.3}Ga_{0.7}As$ layer 705 having a thickness of 6 nm, and a $Ga_{0.47}In_{0.53}As$ cap layer 706 of 50 nm thickness with doped Si of $5\times10^{18}$ cm$^{-3}$, are sequentially grown on the principal surface of the semi-insulated InP substrate 701 by MBE method.

Figure 7D:
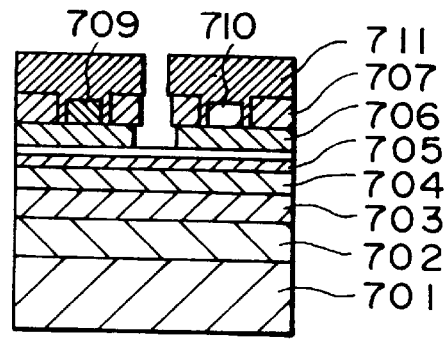
Figure 7B:
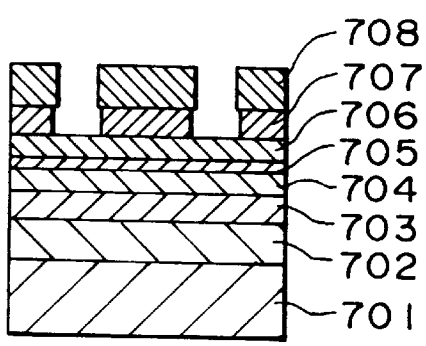
Figure 7E:
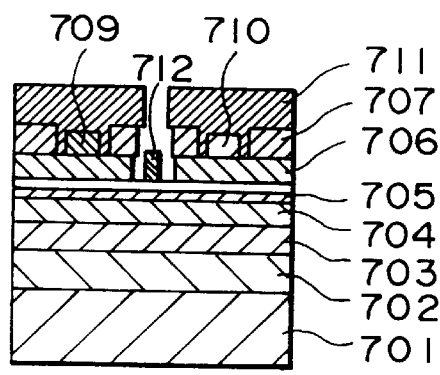
Figure 7C:
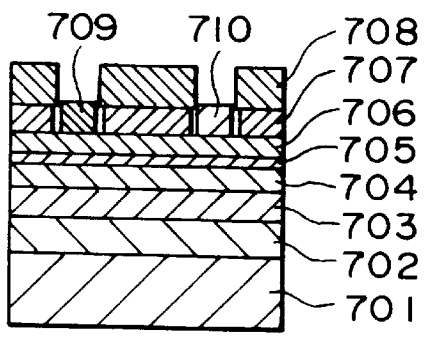
Figure 7F:
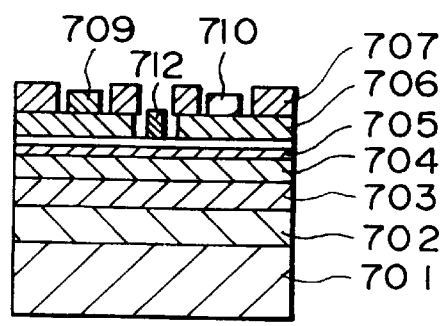

Next, a SiNx spacer layer 707 is formed on the $Ga_{0.47}In_{0.53}As$ cap layer 706, as depicted in FIG. 7B. By the use of an etching mask 708 having opening area for an ohmic electrode region, the SiNx spacer layer 707 is removed by fluoric acid, as illustrated in FIG. 7B. As illustrated in FIG. 7C, an AuGe layer is stacked on the $Ga_{0.47}In_{0.53}As$ cap layer 706 by evaporation lift-off and alloying(for example, 400° C./one minute) to form a source electrode 709 and a drain electrode 710, respectively as ohmic electrodes. On the other hand, the SiNx spacer layer 707 is removed by fluoric acid by the use of an etching mask 711 having an opening area for a gate electrode region while the $Ga_{0.47}In_{0.53}As$ cap layer 706 is removed by a tartaric etchant, as illustrated in FIG. 7D. Thereafter, a gate electrode 712 of WSi is formed on the undoped $Al_{0.3}Ga_{0.7}As$ layer 705, as shown in FIG. 7E. The etching mask 711 is then removed. Accordingly, a semiconductor device of the sixth embodiment is completed, as illustrated in FIG. 7F.

In the sixth embodiment, height of Schottky barrier is as large as 1.0 eV by forming the undoped $Al_{0.3}Ga_{0.7}As$ layer 705 and the $Al_{0.48}In_{0.52}As$ electron supplying layer 704 on the undoped InP channel layer 703. The value is large enough to reduce gate leak current. Defects or dislocations do not occur in each $Al_{0.3}Ga_{0.7}As$ layer. Further, it becomes possible that density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 20V in the InP channel HEMT structure. In addition, frequency dispersion is reduced while mutual conductance is prevented from getting smaller in upper portions. The mutual conductance was as large as 300 mS/mm.

In the sixth embodiment mentioned above, a hetero junction semiconductor crystal is grown on the semi-insulated InP substrate by MBE method. However, a similar hetero junction semiconductor crystal can be obtained by MOCVD method. Moreover, the undoped AlGaAs layer 705 having a composition of $Al_{0.3}Ga_{0.7}As$ is employed in the sixth embodiment. However, a composition of the undoped AlGaAs layer 705 may be $Al_xGa_{1-x}As$ ($0 \leq x \leq 1$) to obtain the same advantageous effect as the above composition of $Al_{0.3}Ga_{0.7}As$.

Referring to FIG. 8, description will proceed to a semiconductor device and a method of manufacturing the semiconductor device according to a seventh embodiment of the present invention.

In FIGS. 8A through 8F, illustrated are sectional views each of which shows each process of the method of manufacturing the semiconductor device according to the seventh embodiment.

Figure 8A:
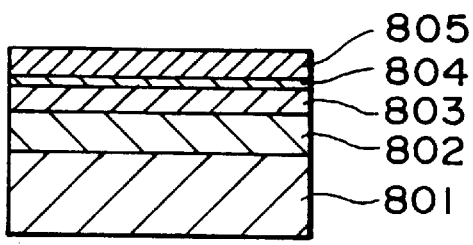
FIGS. 8A to 8F are schematic vertical sectional views of a semiconductor device at various steps of a method according to a seventh embodiment of this invention.

In the example being illustrated, a semi-insulated InP substrate 801 is prepared in a known manner. The semi-insulated InP substrate 801 has a principal surface directed upwards of FIG. 8. As illustrated in FIG. 8A, an undoped $Al_{0.48}In_{0.52}As$ buffer layer 802 having a thickness of 300 nm, an InP channel layer 803 of 100 nm thickness with doped Si of $4\times10^{17}$ cm$^{-3}$, an undoped $Al_{0.3}In_{0.7}P$ Schottky layer 804 of 10 nm thickness, that is such a thickness not larger than the above-defined critical thickness, and a $Ga_{0.47}In_{0.53}As$ cap layer 805 of 50 nm thickness with doped Si of $5\times10^{18}$ cm$^{-3}$ are sequentially grown on the principal surface of the semi-insulated InP substrate 801 by MBE method.

Figure 8B:
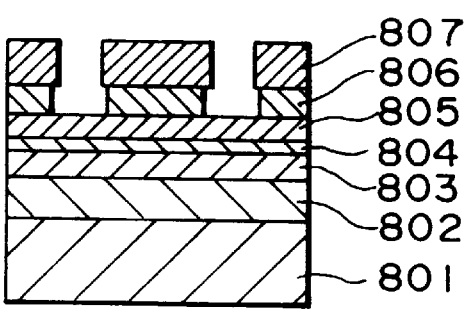
Figure 8C:
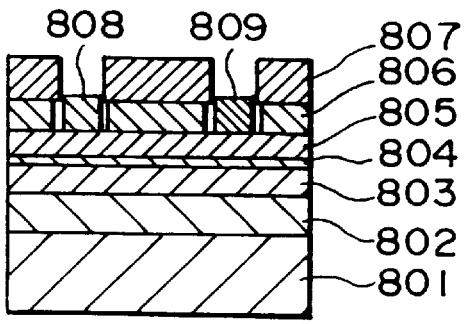
Figure 8D:
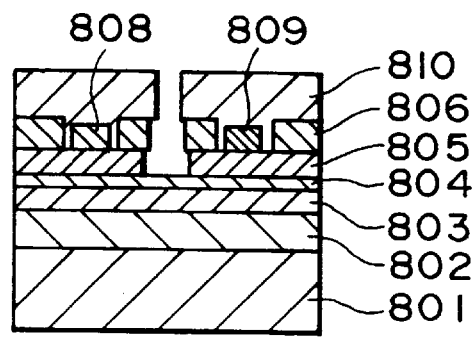
Figure 8E:
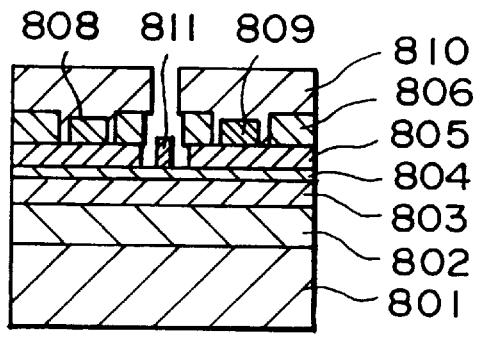
Figure 8F:
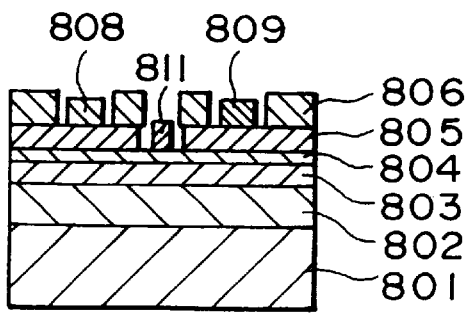

Next, a SiNx spacer layer 806 is formed on the $Ga_{0.47}In_{0.53}As$ cap layer 805, as depicted in FIG. 8B. By the use of an etching mask 807 having opening area for an ohmic electrode region, the SiNx spacer layer 806 is removed by fluoric acid, as illustrated in FIG. 8B. As illustrated in FIG. 7C, an AuGe layer is stacked on the $Ga_{0.47}In_{0.53}As$ cap layer 805 by evaporation lift-off and alloying(for example, 400° C./one minute) to form a source electrode 808 and a drain electrode 809, respectively as ohmic electrodes. On the other hand, the SiNx spacer layer 806 is removed by fluoric acid by the use of an etching mask 810 having an opening area for a gate electrode region while the $Ga_{0.47}In_{0.53}As$ cap layer 805 is removed by a tartaric etchant, as illustrated in FIG. 8D. Thereafter, a gate electrode 811 of WSi is formed on the undoped $Al_{0.3}In_{0.7}P$ Schottky layer 804, as shown in FIG. 8E. The etching mask 810 is then removed. Accordingly, a semiconductor device of the seventh embodiment is completed, as illustrated in FIG. 8F.

In the seventh embodiment, since the InP channel layer 803 and the undoped $Al_{0.3}In_{0.7}P$ Schottky layer 804 are sequentially grown by epitaxy, a steep hetero-interface is successfully formed therebetween. As a result, a channel electron mobility is about 3000 cm-$^2$v$^{-1}$s$^{-1}$. Further, height of Schottky barrier is as large as 0.8 eV by using the $Al_{0.3}In_{0.7}P$ layer as a Schottky layer. The value is large enough to reduce gate leak current. Defects or dislocations do not occur in the $Al_{0.3}In_{0.7}P$ layer. Further, it becomes possible that the density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 15V. In addition, frequency dispersion is reduced while mutual conductance is prevented from getting smaller in upper portions. The mutual conductance was as large as 300 mS/mm.

In the seventh embodiment mentioned above, a hetero junction semiconductor crystal is grown on the semi-insulated InP substrate by MBE method. However, a similar hetero junction semiconductor crystal can be obtained by MOCVD method. Moreover, the undoped AlInP Schottky layer 804 having a composition of $Al_{0.3}In_{0.7}P$ is employed in the seventh embodiment. However, a composition of the undoped AlInP Schottky layer 804 may be $Al_xIn_{1-x}P$ ($1<x\leq1$) to obtain the same advantageous effect as the above composition of $Al_{0.3}In_{0.7}P$. Alternatively, an $Al_xGa_{1-x}P$ ($0\leq x\leq1$) layer having a thickness not larger than the above-defined critical thickness or an $Al_xGa_yIn_{1-x-y}P$ ($0\leq x\leq1$, $0\leq y\leq1$, $0<x+y\leq1$) layer having a thickness not larger than the above-defined critical thickness may be used to obtain a similar advantageous effect.

Referring to FIG. 9, description will proceed to a semiconductor device and a method of manufacturing the semiconductor device according to an eighth embodiment of the present invention.

In FIGS. 9A through 9F, illustrated are sectional views each of which shows each process of the method of manufacturing the semiconductor device according to the eighth embodiment.

Figure 9A:
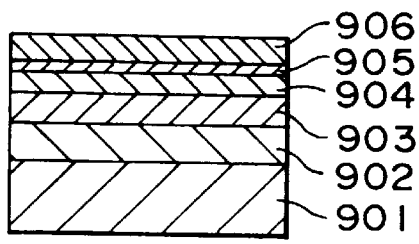
FIGS. 9A to 9F are schematic vertical sectional views of a semiconductor device at various steps of a method according to an eighth embodiment of this invention.

In the example being illustrated, a semi-insulated InP substrate 901 is prepared in a known manner. The semi-Insulated InP substrate 901 has a principal surface directed upwards of FIG. 9. As illustrated in FIG. 9A, an undoped $Al_{0.48}In_{0.52}As$ buffer layer 902 having a thickness of 300 nm, an InP channel layer 903 of 100 nm thickness with doped Si of $4\times10^{17}$ cm$^{-3}$, a Schottky layer consisting of two layers of both an undoped $Al_{0.48}In_{0.52}As$ layer 904 of 15 nm thickness and an undoped $Al_{0.3}In_{0.7}P$ layer 905 of 10 nm thickness, and a $Ga_{0.47}In_{0.53}As$ cap layer 906 of 50 nm thickness with doped Si of $5\times10^{18}$ cm$^{-3}$ are sequentially grown on the principal surface of the semi-insulated InP substrate 901 by MBE method.

Figure 9D:
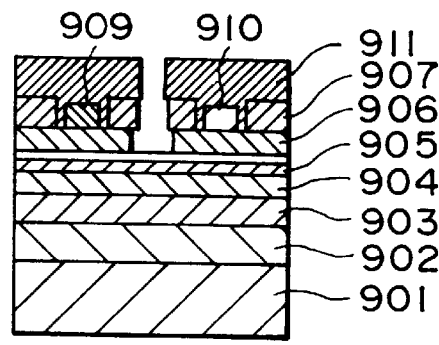
Figure 9B:
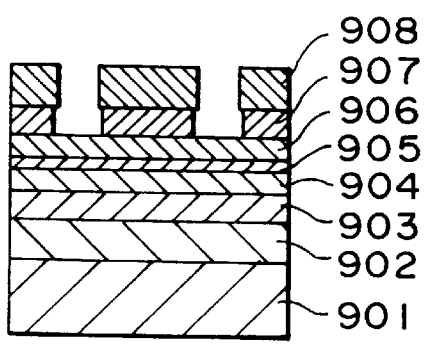
Figure 9E:
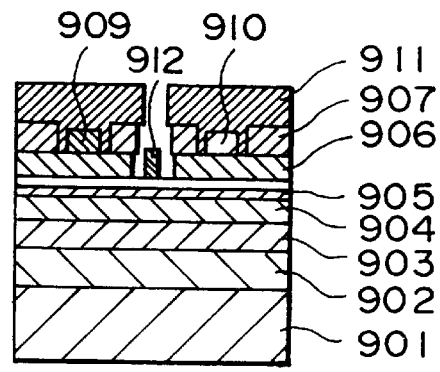
Figure 9C:
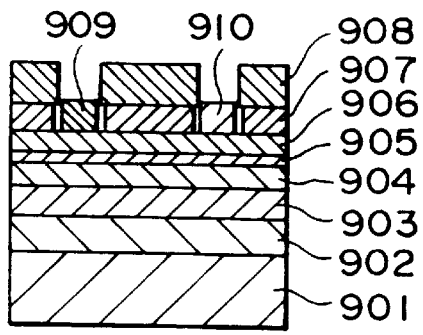
Figure 9F:
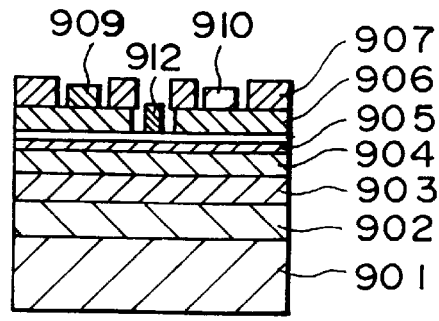

Next, a SiNx spacer layer 907 of 350 nm thickness is formed on the $Ga_{0.47}In_{0.53}As$ cap layer 906, as depicted in FIG. 9B. By the use of an etching mask 908 having opening area for an ohmic electrode region, the SiNx spacer layer 907 is removed by fluoric acid, as illustrated in FIG. 9B. As illustrated in FIG. 9C, an AuGe layer is stacked on the $Ga_{0.47}In_{0.53}As$ cap layer 906 by evaporation lift-off and alloying(for example, 400° C./one minute) to form a source electrode 909 and a drain electrode 910, respectively as ohmic electrodes. On the other hand, the SiNx spacer layer 907 is removed by fluoric acid by the use of an etching mask 911 having an opening area for a gate electrode region while the $Ga_{0.47}In_{0.53}As$ cap layer 906 is removed by a tartaric etchant, as illustrated in FIG. 9D. Thereafter, a gate electrode 912 of WSi is formed on the undoped $Al_{0.3}In_{0.7}P$ layer 905, as shown in FIG. 9E. The etching mask 911 is then removed. Accordingly, a semiconductor device of the eighth embodiment is completed, as illustrated in FIG. 9F.

In the eighth embodiment, height of Schottky barrier is as large as 0.8 eV by using the two layers of both the undoped $Al_{0.48}In_{0.52}As$ layer 904 and the undoped $Al_{0.3}In_{0.7}P$ layer 905 as a Schottky layer. The value is large enough to reduce gate leak current. Defects or dislocations do not occur in the $Al_{0.3}In_{0.7}P$ layer. Further, it becomes possible the density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 18V. In addition, frequency dispersion is reduced while mutual conductance is prevented from getting smaller in upper portions. The mutual conductance was as large as 290 mS/mm.

In the eighth embodiment mentioned above, a hetero junction semiconductor crystal is grown on the semi-insulated InP substrate by MBE method. However, a similar hetero junction semiconductor crystal can be obtained by MOCVD method. Moreover, the undoped AlInP layer 905 having a composition of $Al_{0.3}In_{0.7}P$ is employed in the eighth embodiment. However, a composition of the undoped AlInP layer 905 may be $Al_xIn_{1-x}P$ ($0<x\leq1$) to obtain the same advantageous effect as the above composition of $Al_{0.3}In_{0.7}P$. Alternatively, an $Al_xGa_{1-x}P$ ($0\leq x\leq1$) layer having a thickness not larger than the above-defined critical thickness or an $Al_xGa_yIn_{1-x-y}P$ ($0\leq x\leq1$, $0\leq y\leq1$, $0<x+y\leq1$) layer having a thickness not larger than the above-defined critical thickness may be used to obtain a similar advantageous effect.

Referring to FIG. 10, description will proceed to a semiconductor device and a method of manufacturing the semiconductor device according to a ninth embodiment of the present invention.

In FIGS. 10A through 10F, illustrated are sectional views each of which shows each process of the method of manufacturing the semiconductor device according to the ninth embodiment.

Figure 10A:
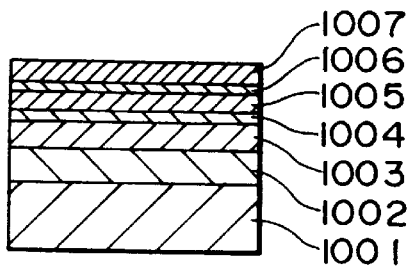
FIGS. 10A to 10F are schematic vertical sectional views of a semiconductor device at various steps of a method according to a ninth embodiment of this invention.

In the example being illustrated, a semi-insulated InP substrate 1001 is prepared in a known manner. The semi-insulated InP substrate 1001 has a principal surface directed upwards of FIG. 10. As illustrated in FIG. 10A, an undoped $Al_{0.48}In_{0.52}As$ buffer layer 1002 having a thickness of 300 nm, an InP channel layer 1003 of 100 nm thickness with doped Si of $4\times10^{17}$ cm$^{-3}$, a Schottky layer consisting of three layers of an undoped $Al_{0.3}In_{0.7}P$ layer 1004 of 10 nm thickness, an undoped $Al_{0.48}In_{0.52}As$ layer 1005 of 10 nm thickness and an undoped $Al_{0.3}In_{0.7}P$ layer 1006 of 10 nm thickness, and a $Ga_{0.47}In_{0.53}As$ cap layer 1007 of 50 nm thickness with doped Si of $5\times10^{18}$ cm$^{-3}$ are sequentially grown on the principal surface of the semi-insulated InP substrate 1001 by MBE method.

Figure 10B:
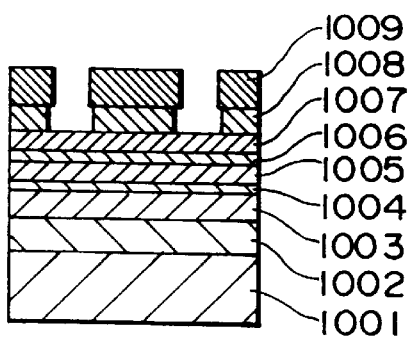
Figure 10C:
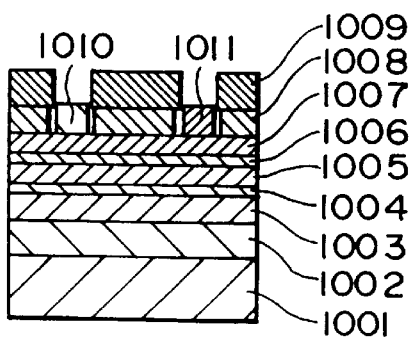
Figure 10D:
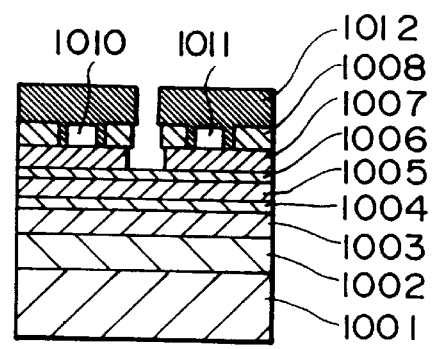
Figure 10E:
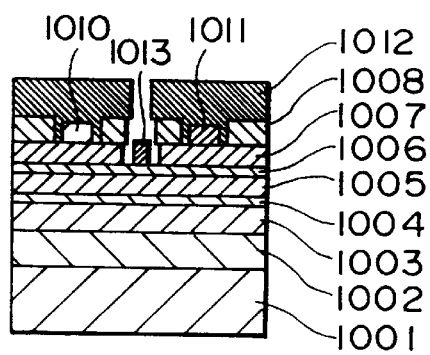
Figure 10F:
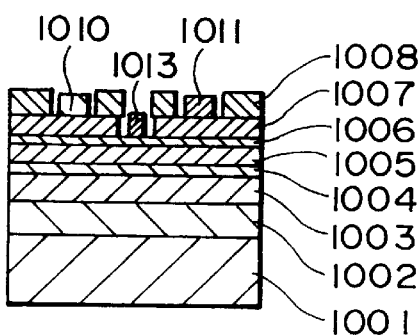

Next, a SiNx spacer layer 1008 of 350 nm thickness is formed on the $Ga_{0.47}In_{0.53}As$ cap layer 1007, as depicted in FIG. 10B. By the use of an etching mask 1009 having opening area for an ohmic electrode region, the SiNx spacer layer 1008 is removed by fluoric acid, as illustrated in FIG. 10B. As illustrated in FIG. 10C, an AuGe layer is stacked on the $Ga_{0.47}In_{0.53}As$ cap layer 1007 by evaporation lift-off and alloying(for example, 400° C./one minute) to form a source electrode 1010 and a drain electrode 1011, respectively as ohmic electrodes. On the other hand, the SiNx spacer layer 1008 is removed by fluoric acid by the use of an etching mask 1012 having an opening area for a gate electrode region while the $Ga_{0.47}In_{0.53}As$ cap layer 1007 is removed by a tartaric etchant, as illustrated in FIG. 10D. Thereafter, a gate electrode 1013 of WSi is formed on the undoped $Al_{0.3}In_{0.7}P$ layer 1006, as shown in FIG. 10E. The etching mask 1012 is then removed. Accordingly, a semiconductor device of the ninth embodiment is completed, as illustrated in FIG. 10F.

In the ninth embodiment, since the InP channel layer 1003 and the undoped $Al_{0.3}In_{0.7}P$ layer 1004 are sequentially grown by epitaxy, a steep hetero-interface is successfully formed therebetween. As a result, a channel electron mobility is about 3000 cm$^2$v$^{-1}$s$^{-1}$. Further, height of Schottky barrier is as large as 0.8 eV by using the three layers of the undoped $Al_{0.3}In_{0.7}P$ layer 1004, the undoped $Al_{0.48}In_{0.52}As$ layer 1005 and the undoped $Al_{0.3}In_{0.7}P$ layer 1006 as a Schottky layer. The value is large enough to reduce gate leak current. Defects or dislocations do not occur in the $Al_{0.3}In_{0.7}P$ layer. Further, it becomes possible that the density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 20V. In addition, frequency dispersion is reduced while mutual conductance is prevented from getting smaller in upper portions. The mutual conductance was as large as 280 mS/mm.

In the ninth embodiment mentioned above, a hetero junction semiconductor crystal is grown on the semi-insulated InP substrate by MBE method. However, a similar hetero junction semiconductor crystal can be obtained by MOCVD method. Moreover, the undoped AlInP layer 1004 and the undoped AlInP layer 1006 each having a composition of $Al_{0.3}In_{0.7}P$ is employed in the ninth embodiment. However, compositions of the undoped AlInP layers 1004 and 1006 may be $Al_xIn_{1-x}P$ ($0<x\leq1$) to obtain the same advantageous effect as the above composition of $Al_{0.3}In_{0.7}P$. Alternatively, an $Al_xGa_{1-x}P$ ($0\leq x\leq1$) layer having a thickness not larger than the above-defined critical thickness or an $Al_xGa_yIn_{1-x-y}P$ ($0\leq x\leq1$, $0\leq y\leq1$, $0<x+y\leq1$) layer having a thickness not larger than the above-defined critical thickness may be used to obtain a similar advantageous fffect.

Referring to FIG. 11, description will proceed to a semiconductor device and a method of manufacturing the semiconductor device according to a tenth embodiment of the present invention.

In FIGS. 11A through 11F, illustrated are sectional views each of which shows each process of the method of manufacturing the semiconductor device according to the tenth embodiment.

Figure 11A:
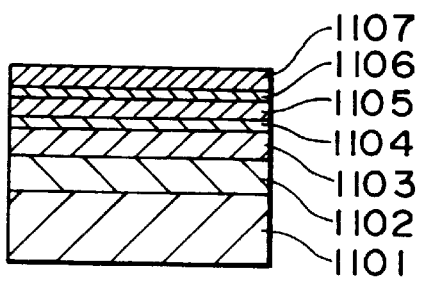
FIGS. 11A to 11F are schematic vertical sectional views of a semiconductor device at various steps of a method according to a tenth embodiment of this invention.

In the example being illustrated, a semi-insulated InP substrate 1101 is prepared in a known manner. The semi-insulated InP substrate 1101 has a principal surface directed upwards of FIG. 11. As illustrated in FIG. 11A, an undoped $Al_{0.48}In_{0.52}As$ buffer layer 1102 having a thickness of 300 nm, an undoped InP channel layer 1103 of 100 nm thickness, an undoped $Al_{0.3}In_{0.7}P$ spacer layer 1104 of 3 nm thickness, an $Al_{0.48}In_{0.52}As$ electron supplying layer 1105 of 20 nm thickness with delta-doped Si of $4\times10^{12}$ cm$^{-2}$, an undoped $Al_{0.3}In_{0.7}P$ layer 1106 of 10 nm thickness, and a $Ga_{0.47}In_{0.53}As$ cap layer 1107 of 50 nm thickness with doped Si of $5\times10^{18}$ cm$^{-3}$ are sequentially grown on the principal surface of the semi-insulated InP substrate 1101 by MBE method.

Figure 11B:
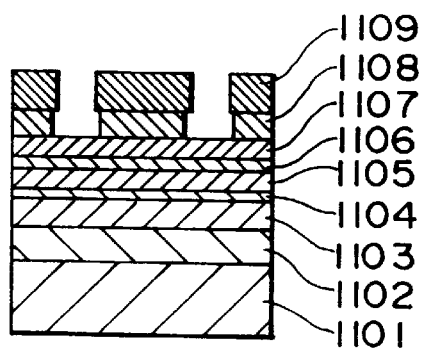
Figure 11C:
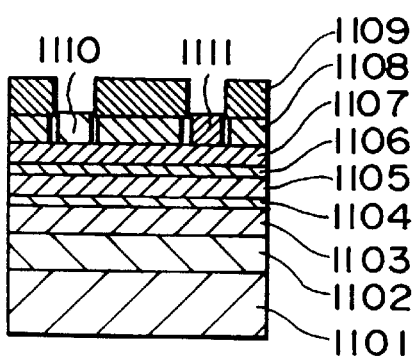
Figure 11D:
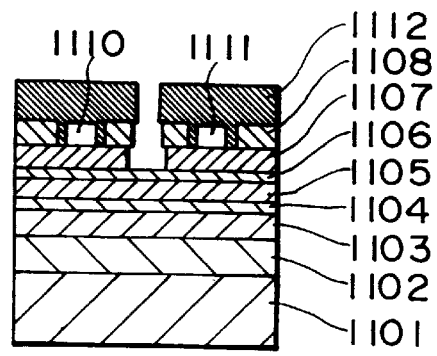
Figure 11E:
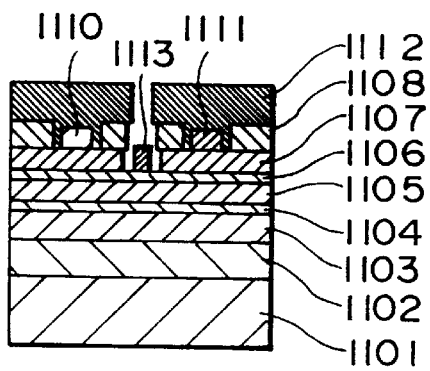
Figure 11F:
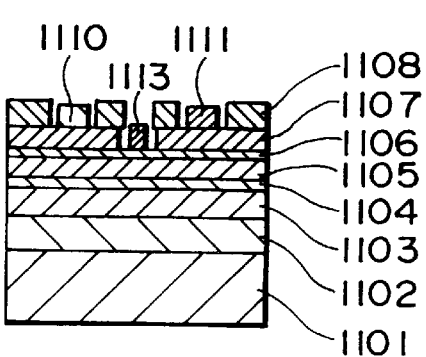

Next, a SiNx spacer layer 1108 of 350 nm thickness is formed on the $Ga_{0.47}In_{0.53}As$ cap layer 1107, as depicted in FIG. 11B. By the use of an etching mask 1109 having opening area for an ohmic electrode region, the SiNx spacer layer 1108 is removed by fluoric acid, as illustrated in FIG. 11B. As illustrated in FIG. 11C, an AuGe layer is stacked on the $Ga_{0.47}In_{0.53}As$ cap layer 1107 by evaporation lift-off and alloying(for example, 400° C./one minute) to form a source electrode 1110 and a drain electrode 1111, respectively as ohmic electrodes. On the other hand, the SiNx spacer layer 1108 Is removed by fluoric acid by the use of an etching mask 1112 having an opening area for a gate electrode region while the $Ga_{0.47}In_{0.53}As$ cap layer 1107 is removed by a tartaric etchant, as illustrated in FIG. 11D. Thereafter, a gate electrode 1113 of WSi is formed on the undoped $Al_{0.3}In_{0.7}P$ layer 1106, as shown in FIG. 11E. The etching mask 1112 is then removed. Accordingly, a semiconductor device of the tenth embodiment is completed, as illustrated in FIG. 11F.

In the tenth embodiment, since the undoped InP channel layer 1103 and the undoped $Al_{0.3}In_{0.7}P$ spacer layer 1104 are sequentially grown by epitaxy, a steep hetero-interface is successfully formed therebetween. As a result, two-dimensional mobility of an electron gus in the InP channel region is about 5000 cm$^2$v$^{-1}$s$^{-1}$. Further, height of Schottky barrier is as large as 0.8 eV by forming the undoped $Al_{0.3}In_{0.7}P$ spacer layer 1104, the $Al_{0.48}In_{0.52}As$ electron supplying layer 1105 and the undoped $Al_{0.3}In_{0.7}P$ layer 1106 on the undoped InP channel layer 1103. The value is large enough to reduce gate leak current. Defects or dislocations do not occur in each $Al_{0.3}In_{0.7}P$ layer. Further, it becomes possible that the density of surface states is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 20V in the InP channel HEMT structure. In addition, frequency dispersion is reduced while mutual conductance is prevented from getting smaller in upper portions. The mutual conductance was as large as 280 mS/mm.

In the tenth embodiment mentioned above, a hetero junction semiconductor crystal is grown on the semi-insulated InP substrate by MBE method. However, a similar hetero junction semiconductor crystal can be obtained by MOCVD method. Moreover, the undoped AlInP spacer layer 1104 and the undoped AlInP layer 1106 each having a composition of $Al_{0.3}In_{0.7}P$ is employed in the tenth embodiment. However, compositions of the undoped AlInP layers 1104 and 1106 may be $Al_xIn_{1-x}P$ ($0 \leq x \leq 1$) to obtain the same advantageous effect as the above composition of $Al_{0.3}In_{0.7}P$. Alternatively, an $Al_xGa_{1-x}P$ ($0 \leq x \leq 1$) layer having a thickness not larger than the above-defined critical thickness or an $Al_xGa_yIn_{1-x-y}P$ ($0 \leq x \leq 1, 0 \leq y \leq 1, 0 < x+y \leq 1$) layer having a thickness not larger than the above-defined critical thickness may be used to obtain a similar advantageous effect.

Referring to FIG. 12, description will proceed to a semiconductor device and a method of manufacturing the semiconductor device according to an eleventh embodiment of the present invention.

In FIGS. 12A through 12F, illustrated are sectional views each of which shows each process of the method of manufacturing the semiconductor device according to the eleventh embodiment.

Figure 12A:
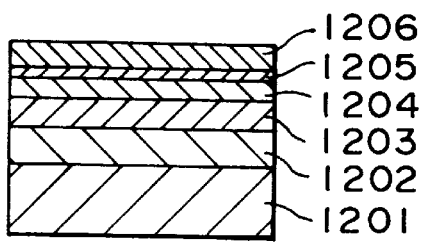
FIGS. 12A to 12F are schematic vertical sectional views of a semiconductor device at various steps of a method according to an eleventh embodiment of this invention.

In the example being illustrated, a semi-insulated InP substrate 1201 is prepared in a known manner. The semi-insulated InP substrate 1201 has a principal surface directed upwards of FIG. 12. As illustrated in FIG. 12A, an undoped $Al_{0.48}In_{0.52}As$ buffer layer 1202 having a thickness of 300 nm, an undoped InP channel layer 1203 of 100 nm thickness, an $Al_{0.48}In_{0.52}As$ electron supplying layer 1204 of 20 nm thickness with delta-doped Si of $4 \times 10^{12}$ cm$^{-2}$, an undoped $Al_{0.3}In_{0.7}P$ layer 1205 of 6 nm thickness, and a $Ga_{0.47}In_{0.53}As$ cap layer 1206 of 50 nm thickness with doped Si of $5 \times 10^{18}$ cm$^{-3}$ are sequentially grown on the principal surface of the semi-insulated InP substrate 1201 by MBE method.

Figure 12D:
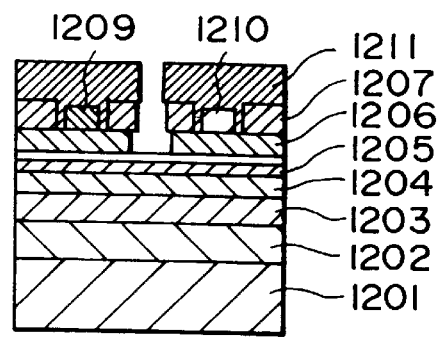
Figure 12B:
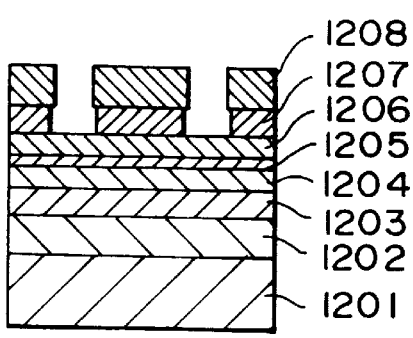
Figure 12E:
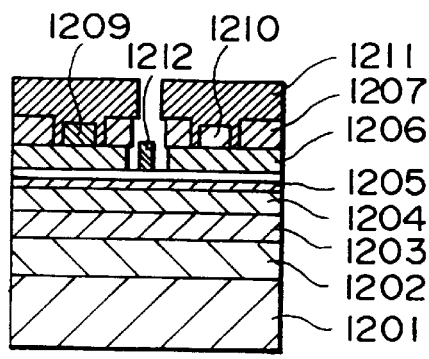
Figure 12C:
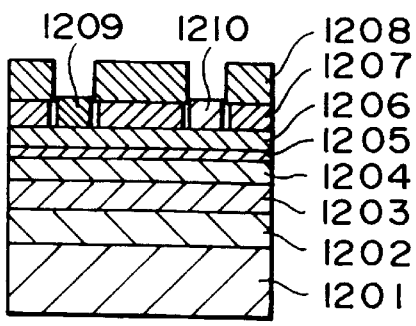
Figure 12F:
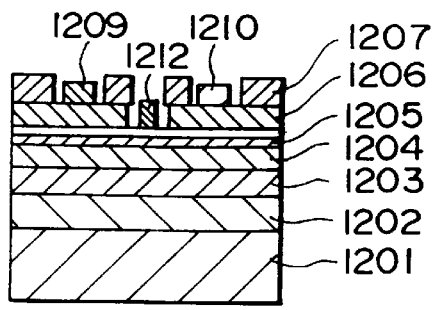

Next, a SiNx spacer layer 1207 of 350 nm thickness is formed on the $Ga_{0.47}In_{0.53}As$ cap layer 1206, as depicted in FIG. 12B. By the use of an etching mask 1208 having opening area for an ohmic electrode region, the SiNx spacer layer 1207 is removed by fluoric acid, as illustrated in FIG. 12B. As illustrated in FIG. 12C, an AuGe layer is stacked on the $Ga_{0.47}In_{0.53}As$ cap layer 1206 by evaporation lift-off and alloying(for example, 400° C./one minute) to form a source electrode 1209 and a drain electrode 1210, respectively as ohmic electrodes. On the other hand, the SiNx spacer layer 1207 is removed by fluoric acid by the use of an etching mask 1211 having an opening area for a gate electrode region while the $Ga_{0.47}In_{0.53}As$ cap layer 1206 is removed by a tartaric etchant, as illustrated in FIG. 12D. Thereafter, a gate electrode 1212 of WSi is formed on the undoped $Al_{0.3}In_{0.7}P$ layer 1205, as shown in FIG. 12E. The etching mask 1211 is then removed. Accordingly, a semiconductor device of the eleventh embodiment is completed, as illustrated in FIG. 12F.

In the eleventh embodiment, height of Schottky barrier is as large as 0.8 eV by forming the $Al_{0.48}In_{0.52}As$ electron supplying layer 1204 and the undoped $Al_{0.3}In_{0.7}P$ layer 1205 on the undoped InP channel layer 1203. The value is large enough to reduce gate leak current. Defects or dislocations do not occur in the $Al_{0.3}In_{0.7}P$ layer. Further, it becomes possible that density of surface state is within an order of $10^{10}$ cm$^{-2}$v$^{-1}$. Moreover, distance between the gate and the channel region is small, although a desirable breakdown voltage is achieved. Consequently, an excellent pinch-off characteristic is achieved up to a drain voltage of about 20V in the InP channel HEMT structure. In addition, frequency dispersion is reduced while mutual conductance is prevented from getting smaller in upper portions. The mutual conductance was as large as 300 mS/mm.

In the eleventh embodiment mentioned above, a hetero junction semiconductor crystal is grown on the semi-insulated InP substrate by MBE method. However, a similar hetero junction semiconductor crystal can be obtained by MOCVD method. Moreover, the undoped AlInP layer 1205 having a composition of $Al_{0.3}In_{0.7}P$ is employed in the eleventh embodiment. However, the composition of the undoped AlInP layer 1205 may be $Al_xIn_{1-x}P$ ($0 \leq x \leq 1$) to obtain the same advantageous effect as the above composition of $Al_{0.3}In_{0.7}P$. Alternatively, an $Al_xGa_{1-x}P$ ($0 \leq x \leq 1$) layer having a thickness not larger than the above-defined critical thickness or an $Al_xGa_yIn_{1-x-y}P$ ($0 \leq x \leq 1, 0 \leq y \leq 1, 0 < x+y \leq 1$) layer having a thickness not larger than the above-defined critical thickness may be used to obtain a similar advantageous effect.

What is claimed is:

1. A field effect transistor which consists mainly of a semiconductor crystal having an InP layer and which includes source, drain and gate electrodes, said field effect transistor comprising:

a SiNx spacer layer which separates said source, said drain and said gate electrodes from each other; and an InN film formed between said InP layer and said SiNx spacer layer.

2. A field effect transistor which consists mainly of a semiconductor crystal and which includes source, drain and gate electrodes, said field effect transistor comprising:

a primary layer having a primary composition of InP;

a secondary layer which is formed on said primary layer and which is constituted by a layer structure selected from the group consisting of AlGaAs/AlInAs, GaAs/AlInAs, AlInP/AlInAs, AlGaP/AlInAs, and AlGaInP/AlInAs; and a SiNx spacer layer which separates said source, said drain and said gate electrodes from each other.

3. A field effect transistor which consists mainly of a semiconductor crystal and which includes source, drain and gate electrodes, said field effect transistor comprising:

a primary layer having a primary composition of InP; and a secondary layer which is formed on said primary layer and which is constituted by a layer structure selected from the group consisting of AlGaAs/AlInAs/AlGaAs, GaAs/AlInAs/GaAs, AlInP/AlInAs/AlInP, AlGaP/AlInAs/AlGaP, and AlGaInP/AlInAs/AlGaInP; and a SiNx spacer layer which separates said source, said drain and said gate electrodes from each other.

* * * * *

UNITED STATES PATENT AND TRADEMARK OFFICE
CERTIFICATE OF CORRECTION

PATENT NO. : 6,025,613
DATED : February 15, 2000
INVENTOR(S) : Yasunori Bito, et. al.

It is certified that error appears in the above-indentified patent and that said Letters Patent is hereby corrected as shown below:

Column 1, line 17 delete "Retero", insert --Hetero--p. 1, line 16
Column 7, line 19 delete "cm$^{312}$", insert --cm$^{-2}$--
Column 9, line 35 delete "v$^{9-1}$", insert --V$^{-1}$--
Column 14, line 47 delete "gus", insert --gas--

Signed and Sealed this

Twentieth Day of March, 2001

Attest:

NICHOLAS P. GODICI

Attesting Officer          Acting Director of the United States Patent and Trademark Office